United States Patent [19]

Hirano et al.

[11] Patent Number: 5,986,857
[45] Date of Patent: Nov. 16, 1999

[54] THIN FILM MAGNETIC HEAD INCLUDING ADHESION ENHANCING INTERLAYERS, AND UPPER AND LOWER GAP INSULATIVE LAYERS HAVING DIFFERENT HYDROGEN CONTENTS AND INTERNAL STRESS STATES

[75] Inventors: Hitoshi Hirano, Nishinomiya; Yoichi Domoto, Ikoma; Keiichi Kuramoto, Kadoma; Hisaki Tarui, Osaka, all of Japan

[73] Assignee: Sanyo Electric Co., Ltd., Moriguchi, Japan

[21] Appl. No.: 09/023,016

[22] Filed: Feb. 11, 1998

[30] Foreign Application Priority Data

| Feb. 13, 1997 | [JP] | Japan | 9-029111 |
| Mar. 4, 1997 | [JP] | Japan | 9-049386 |
| Sep. 25, 1997 | [JP] | Japan | 9-259832 |

[51] Int. Cl.⁶ .................................................. G11B 5/39
[52] U.S. Cl. .................................................. 360/113
[58] Field of Search ................................ 360/113, 126

[56] References Cited

U.S. PATENT DOCUMENTS

| 4,728,529 | 3/1988 | Etzkorn et al. |  |
| 5,699,605 | 12/1997 | Amin | 360/126 |
| 5,838,521 | 11/1998 | Ravipati | 360/113 |

FOREIGN PATENT DOCUMENTS

| 0584707 | 3/1994 | European Pat. Off. . |
| 1-075678 | 3/1989 | Japan . |
| 1-302203 | 12/1989 | Japan . |
| 3-028195 | 2/1991 | Japan . |
| 3-199376 | 8/1991 | Japan . |
| 4-366901 | 12/1992 | Japan . |
| 5-274626 | 10/1993 | Japan . |
| 6-195640 | 7/1994 | Japan . |
| 6-223331 | 8/1994 | Japan . |
| 7-320236 | 8/1995 | Japan . |

OTHER PUBLICATIONS

Applied Physics, vol. 56, No. 7 (1987), pp. 923–924.

A. Raveh et al.; "Structure–property relationships in dual–frequency plasma deposited hard a–C: H films"; Surface and Coatings Technology, vol. 53, No. 3, Nov. 10, 1992, pp. 275 to 282.

T. L. Chu et al.; "Hydrogenated amorphous silicon films by the pyrolysis of disilane"; Materials Issues in Applications of Amorphous Silicon Technology, San Francisco, CA; 1985; pp. 21 to 26.

B. Meyerson et al.; "Chemical modification of the electrical properties of hydrogenated amorphous carbon films"; Solid State Communications, vol. 34, No. 7, May 1, 1980; pp. 531 to 534.

*Primary Examiner*—A. J. Heinz
*Attorney, Agent, or Firm*—W. F. Fasse; W. G. Fasse

[57] ABSTRACT

A thin film magnetic head includes a magnetoresistive element portion movable over and relative to a magnetic recording medium for reading information stored therein, upper and lower shielding layers disposed with the magnetoresistive element portion therebetween for magnetically shielding the magnetoresistive element portion, and upper and lower gap insulative layers respectively interposed between the upper shielding layer and the magnetoresistive element portion and between the lower shielding layer and the magnetoresistive element portion. Each of the upper and lower gap insulative layers includes a hydrogen-incorporated film. The upper gap insulative layer has an increased hydrogen content and a reduced internal stress relative to the lower gap insulative layer.

28 Claims, 9 Drawing Sheets

THIN FILM MAGNETIC HEAD INCLUDING ADHESION ENHANCING INTERLAYERS, AND UPPER AND LOWER GAP INSULATIVE LAYERS HAVING DIFFERENT HYDROGEN CONTENTS AND INTERNAL STRESS STATES

BACKGROUND OF THE INVENTION

1. Field of the Invention

The present invention relates to a thin film magnetic head which can be employed for information processing devices such as personal computers or workstations, and which has a magnetoresistive element portion that moves over and relative to a magnetic writing or recording medium (hereinafter referred to as a recording medium), such as a hard or floppy disk, to read stored information.

2. Description of Related Art

Thin film magnetic heads have been conventionally employed in effecting high density recording of information onto the recording medium. One example of such thin film magnetic heads is described in Japanese Patent Laying-open No. Hei 6-223331 (1994). FIG. 7 is a schematic cross-sectional view of such a prior art magnetic head.

As shown in FIG. 7, the prior art thin film magnetic head has a substrate 1 on which an insulative layer 20 formed of diamond-like carbon (hereinafter referred to as DLC), a shielding layer 3, an insulative layer 21 formed of DLC, a magnetoresistive element portion (hereinafter referred to as an MR element layer 5), lead layers 6-A and 6-B, an insulative layer 22 formed of DLC, and a shielding layer 8 are stacked in such a consecutive order.

FIG. 8 is a partly enlarged view of the MR element layer 5 and lead layers 6-A and 6-B in FIG. 7.

Referring now to FIGS. 7 and 8, the lead layers 6-A and 6-B are coupled to opposite ends of the MR element layer 5. The MR element layer 5 has a nonmagnetic interlayer 11 sandwiched between a magnetoresistive layer 12 and a soft magnetic layer 10 which is closest of the three to the substrate 1. The soft magnetic layer 10 is a film for applying a bias electric field to the magnetoresistive layer 12. The nonmagnetic interlayer 11 is a film for magnetically isolating the soft magnetic layer 10 from the magnetoresistive layer 12 which is a film for converting magnetic flux changes to signals.

Each of the lead layers 6-A and 6-B has an antiferromagnetic bias layer 13 on which an adherence enhancing layer 14 and a conductive lead layer 15 are consecutively stacked. The lead layers 6-A and 6-B define an operational region 6-C therebetween.

When desired to read information stored in the recording medium using the above-described thin film magnetic head, a rated current is applied to the lead layer 6-A to allow the rated current to flow therefrom through the MR element layer 5 to the lead layer 6-B. The current flowing into the MR element layer 5 produces an electric field perpendicular to a direction of the current flow, inducing magnetic fields in the magnetoresistive layer 12 as well as the soft magnetic layer 10, so that the magnetoresistive layer 12 is biased in the direction of the current flow through a coupling effect.

When subjected to an external magnetic field while in such a biased state, the magnetoresistive layer 12 changes in its resistance with varying magnetic field. The output can be obtained by processing the resistance changes as signals.

However, DLC layers are generally high in internal stress, particularly in compressive stress. Due to the action of this compressive stress, a tensile force acts on a body adhered to the DLC.

In the above-described thin film magnetic head, the lead layers 6-A and 6-B, as well as the MR element layer 5, are sandwiched between the insulative layers 21 and 22. Accordingly, the compressive forces generated in the insulative layers 21 and 22 are likely to act to deform the MR element layer 5, leading to failure of obtaining desired electrical characteristics and, as a consequence, loss of reliability.

Furthermore, forming the insulative layers having a high compressive stress directly on the shielding layers, as described above, is very likely to cause upper layers including the insulative layers to be delaminated from the substrate when subjected to the action of compressive forces in the insulative layers.

SUMMARY OF THE INVENTION

It is an object of the invention to provide a highly reliable thin film magnetic head which exhibits excellent wear resistance as well as prolonged service life.

A magnetic head in accordance with a first aspect of the invention characteristically includes a magnetoresistive element portion (MR element portion) movable over and relative to a magnetic recording medium for reading informations stored therein, upper and lower shielding layers disposed to locate the magnetoresistive element portion therebetween for magnetically shielding the magnetoresistive element portion, and upper and lower gap insulative layers respectively interposed between the upper shielding layer and the magnetoresistive element portion and between the lower shielding layer and the magnetoresistive element portion. As a significant feature, each of the upper and lower gap insulative layers comprises a hydrogen-incorporated film and the hydrogen contents of the upper and lower gap insulative layers are rendered different from each other.

In the first aspect of the present invention, the hydrogen content of the upper gap insulative layer is preferably higher than that of the lower gap insulative layer.

In accordance with the first aspect of the present invention, the hydrogen content of the upper gap insulative layer is preferably in the range of 45–65 atomic percent, more preferably in the range of 50–60 atomic percent, while the hydrogen content of the lower gap insulative layer is preferably in the range of 5–45 atomic percent, more preferably in the range of 5–30 atomic percent. The hydrogen content can be determined, for example, by secondary ion mass spectrometry (SIMS).

In the first aspect of the present invention, the hydrogen-incorporated film for each of the upper and lower gap insulative layers is preferably a hydrogenated amorphous carbon film. The hydrogenated amorphous carbon film is such a film as is generally called a diamond-like carbon film (DLC film). Also, a silicon film can be employed to form a hydrogen-incorporated film for each of the upper and lower gap insulative layers. Since the DLC and silicon films are excellent in thermal conductivity, they dissipate heat very quickly to prevent excessive temperature elevation in the MR element portion so that a service life of the MR element portion can be prolonged.

Generally for the DLC film, its internal stress and hardness tend to decrease with increasing hydrogen content thereof. Accordingly, as the hydrogen content of the upper gap insulative layer is rendered higher compared to that of the lower gap insulative layer, the upper gap insulative layer will exhibit a reduced internal stress and a reduced hardness relative to the lower gap insulative layer.

In general, the film layers of the thin film magnetic head are consecutively stacked on a substrate, respectively by a thin film forming method. In such a case, the formation of the MR element portion follows that of the lower gap insulative layer but precedes that of the upper gap insulative layer. Accordingly, the internal stress of the upper gap insulative layer generally exerts greater influence upon the MR element portion relative to that of the lower gap insulative layer. Therefore, the service life of the MR element portion can be effectively prolonged to result in its increased reliability by designing the upper gap insulative layer as having a decreased internal stress relative to the lower gap insulative layer.

In accordance with the first aspect of the present invention, one of the upper and lower gap insulative layers can be reduced in hardness relative to the other by differentiating the hydrogen contents thereof from each other. Thus, the wear-resistance of the MR element portion, interposed between the upper and lower gap insulative layers, can be increased by imparting increased hardness to either one of the gap insulative layers. Since the upper gap insulative layer desirably has a decreased internal stress relative to the lower gap insulative layer, as described above, it is preferred to design the lower gap insulative layer as having an increased hardness relative to the upper gap insulative layer.

A magnetic head in accordance with a second aspect of the invention includes a magnetoresistive element portion (MR element portion) movable over and relative to a magnetic recording medium for reading information stored therein, upper and lower shielding layers disposed to locate the magnetoresistive element portion therebetween for magnetically shielding the magnetoresistive element portion, and upper and lower gap insulative layers respectively interposed between the upper shielding layer and the magnetoresistive element portion and between the lower shielding layer and the magnetoresistive element portion. As significant features, each of the upper and lower gap insulative layers comprises a hydrogen-incorporated film and the internal stresses of the upper and lower gap insulative layers are rendered different from each other.

In the second aspect of the present invention, the internal stress of the upper gap insulative layer is preferably lower than that of the lower gap insulative layer. This enables a reduced influence of the internal stress upon the MR element portion to result in a highly reliable thin film magnetic head having a prolonged service life.

The internal stress of the upper gap insulative layer is preferably in the range of 0.01–4 GPa while the internal stress of the lower gap insulative layer is preferably in the range of 4–10 GPa.

If the internal stress of the upper gap insulative layer is rendered lower than that of the lower gap insulative layer, the lower gap insulative layer will exhibit increased hardness relative to the upper gap insulative layer.

In the second aspect of the present invention, the hydrogen-incorporated film for each of the upper and lower gap insulative layers preferably comprises a hydrogenated amorphous carbon film, similar to those in the first aspect of the present invention. Also, a silicon film can be employed to form the hydrogen-incorporated film for each of the upper and lower gap insulative layers.

In the case where the DLC film is employed as the hydrogen-incorporated film, its internal stress and hardness can be generally reduced by increasing its hydrogen content. Thus, in the second aspect of the present invention, the hydrogen content of the upper gap insulative layer is preferably rendered higher than that of the lower gap insulative layer.

Explanations will now be given concerning the matters common to the first and second aspects of the present invention.

In the case that each of said upper and lower gap insulative layers is comprised of a hydrogenated amorphous carbon film, this amorphous hydrogenated carbon film may contain at least one element selected from Si, B, N and O. The incorporation of Si, B, N or O improves sliding characteristics thereof while the incorporation of N serves to reduce an internal stress therein. The content of incorporated element(s) preferably ranges from 2 to 80 atomic percent.

An interlayer may be disposed between the lower gap insulative layer and the lower shielding layer. The provision of such an interlayer serves to improve adhesion of the lower gap insulative layer.

The above mentioned type of interlayer may be either alternatively or additionally disposed between the upper gap insulative layer and the magnetoresistive element portion. The provision of this interlayer serves to improve adhesion of the upper gap insulative layer.

The interlayer may be provided either in such a continuous film form as coexpansive with the neighboring layers or in such an intermittent form as consisting of plural island portions sandwiched between the neighboring layers.

A film thickness of the interlayer is preferably not greater than 200 Å. Also, the film thickness of the interlayer is preferably not greater than one fifth of a film thickness of the corresponding upper or lower gap insulative layer.

The interlayer can be formed of Si, Ru, Mo, W, Cr, C, Ge, Hf, Zr, or Ti. Any of those elements each combined with at least one element selected from nitrogen, oxygen and carbon may also be employed to form the interlayer.

In the first and second aspects of the present invention, when the upper gap insulative layer or/and the lower gap insulative layer is comprised of a hydrogenated amorphous carbon film, an internal stress relaxation layer may be included therein. Such an internal stress relaxation layer may be incorporated in plurality within the amorphous carbon film.

The internal stress relaxation layer can be formed of a carbon film containing substantially no hydrogen, for example. Such a carbon film containing substantially no hydrogen may be formed such as by sputtering.

Also, the internal stress relaxation layer can be formed of Si, Ru, Mo, W, Cr, Ge, Hf, Zr or Ti. Any of those elements each combined with at least one element selected from nitrogen, oxygen and carbon may also be employed to form the internal stress relaxation layer.

In a particular embodiment of the present invention, the above amorphous carbon film incorporating the internal stress relaxation layer(s) comprises a plurality of carbon layers having an equivalent thickness a alternating with a plurality of internal stress relaxation layers having an equivalent thickness b. In such a case, the ratio a/b is preferably in the range of 1–1000, more preferably in the range of 10–500. Such a carbon layer specifically in surface contact with the internal stress relaxation layer is hereinafter referred to simply as a carbon layer.

Also, a ratio in hardness of each carbon layer relative to each internal stress relaxation layer, that is, (hardness of each carbon layer)/(hardness of each internal stress relaxation layer) is preferably not less than 10.

Also, a ratio in internal stress of each carbon layer relative to each internal stress relaxation layer, that is, (internal stress of each carbon layer)/(internal stress of each internal stress relaxation layer) is preferably not less than 100. The film thickness a of each carbon layer preferably ranges from about 50 Å to about 5 μm, more preferably from about 100 Å to about 1 μm. The film thickness b of each internal stress relaxation layer preferably ranges from about 5 Å to about 5 μm, more preferably from about 10 Å to about 1 μm.

The presence of the internal stress relaxation layer(s) interior or inside of the amorphous carbon film acts to relax internal stresses in the carbon layers flanking the internal stress relaxation layer, so that a total internal stress of the amorphous carbon film can be effectively reduced.

In the first and second aspects of the present invention, such an internal stress relaxation layer may be incorporated at least in the upper gap insulative layer, since the internal stress of the upper gap insulative layer is preferably smaller than that of the lower gap insulative layer.

The hydrogen content of the upper or/and lower gap insulative layer is preferably in the range of 5–65 atomic percent. Also, 25% or greater of carbon—carbon bonds present in the upper or/and lower gap insulative layer are preferably occupied by $sp^3$ carbon—carbon bonds. The internal stress of the upper or/and lower gap insulative layer is preferably in the range of 0.5–9.0 GPa. Also, a specific resistance of the upper or/and lower gap insulative layer is preferably in the range of $10^9$–$10^{12}$ Ω·cm.

A thin film magnetic head in accordance with the third aspect of the present invention includes a magnetoresistive element portion movable over and relative to a magnetic recording medium for reading information stored therein, upper and lower shielding layers disposed to locate the magnetoresistive element portion therebetween for magnetically shielding the magnetoresistive element portion, and upper and lower gap insulative layers respectively interposed between the upper shielding layer and the magnetoresistive element portion and between the lower shielding layer and the magnetoresistive element portion. The thin film magnetic head further includes a first interlayer disposed between the lower gap insulative layer and the lower shielding layer, and a second interlayer disposed between the upper gap insulative layer and the magnetoresistive element portion.

Also in the third aspect of the present invention, each of the upper and lower gap insulative layers preferably comprises a hydrogenated amorphous carbon film, similar to the first and second aspects of the present invention. Also, the first and second interlayers are preferably analogous to those in accordance with the first and second aspects of the present invention.

DESCRIPTION OF THE PREFERRED EMBODIMENTS

Figure 1:
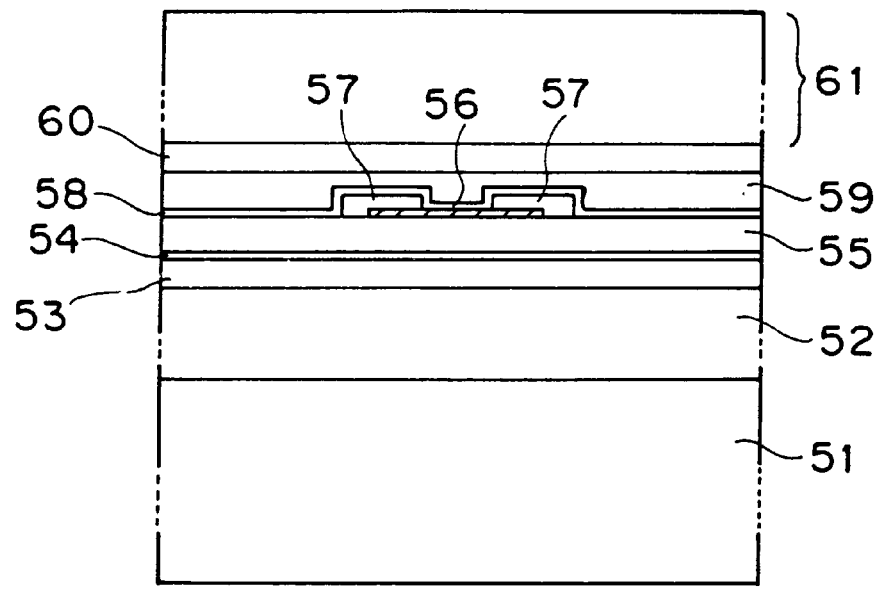
FIG. 1 is a schematic cross-sectional view of one embodiment of a thin film magnetic head of the present invention.

One embodiment of the present invention will be now explained with reference to FIGS. 1 through 6.

One embodiment of a thin film magnetic head in accordance with the present invention can be manufactured according to the following steps (1) through (9) which will be explained below referring to FIG. 1.

(1) An insulative layer 52 (such as of $Al_2O_3$) and a lower shielding layer 53 (such as comprised of an Ni-based alloy, e.g. permalloy) are formed on an $Al_2O_3$-TiC substrate 51 to form a particular wafer (hereinafter referred to simply as a wafer) which is subsequently placed on a substrate holder.

(2) A first interlayer 54, such as of Si, is sputter formed on the wafer.

(3) A lower gap insulative layer 55, such as comprised of a DLC film, is formed on the first interlayer.

(4) An MR element layer 56, such as of an Ni-based alloy, is sputter formed on a predetermined region of the lower gap insulative layer 55.

(5) An electrode layer 57, such as of Au, is sputter formed on a predetermined region of the MR element layer 56.

(6) A second interlayer 58, such as of Si, is sputter formed at least on the electrode layer 57 and the MR element layer 56.

(7) An upper gap insulative layer 59, such as comprised of a DLC film, is formed at least on the second interlayer 58.

(8) An upper shielding layer 60, such as comprised of an Ni-based alloy, e.g. permalloy, is sputter formed on the upper gap insulative layer 59.

(9) An induction-type magnetic head part 61 is formed on the upper shielding layer 60.

Figure 5:
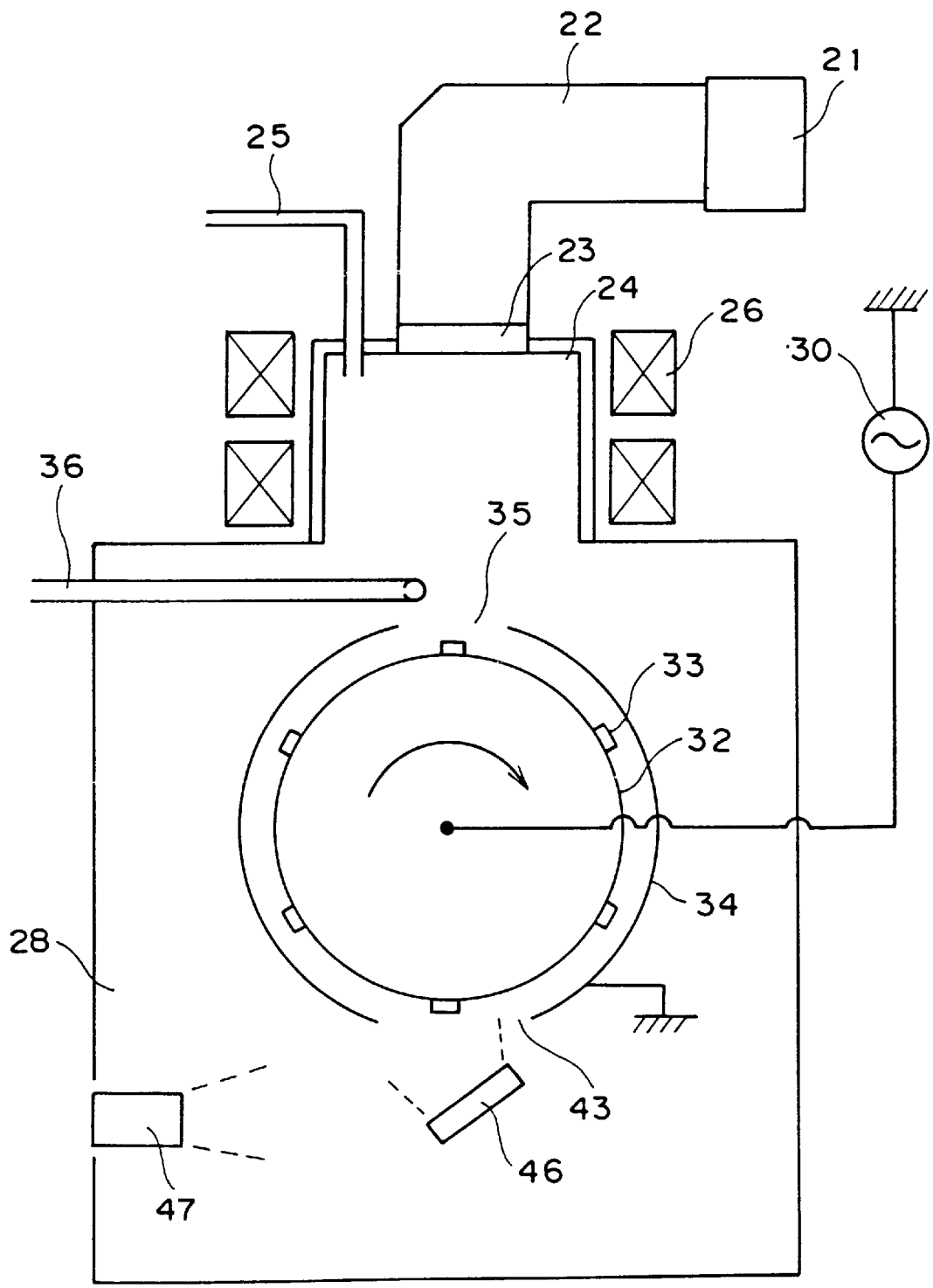
FIG. 5 is a schematic cross-sectional view of one exemplary apparatus for forming first and second interlayers as well as the upper and lower gap insulative layers.

Among the above-described steps, the second, third, sixth and seventh steps can be performed, such as by an ECR plasma generator shown in FIG. 5. Accordingly, as the ECR plasma generator shown in FIG. 5 completes the processes of the second and third steps, the wafer is transferred to another film forming means, e.g. sputtering means, in which the processes of the fourth and fifth steps are carried out. Thereafter, the wafer is again returned to the ECR plasma generator shown in FIG. 5 in which the subsequent processes are carried out.

FIG. 5 is a schematic cross-sectional view of an exemplary apparatus for forming, on the wafer, the first interlayer (formed according to the second step), the second interlayer (formed according to the sixth step), the lower gap insulative layer (formed according to the third step) and the upper gap insulative layer (formed according to the seventh step).

Referring to FIG. 5, a plasma generation chamber 24 is arranged within a vacuum chamber 28 to which one end of a waveguide 22 is connected. Another end of the waveguide 22 is mounted to a microwave supplying means 21. Microwaves generated in the microwave supplying means 21 pass through the waveguide 22 and a microwave inlet window 23 to be guided into the plasma generation chamber 24.

Connected to the plasma generation chamber 24 is a discharge gas inlet line 25 for introducing a discharge gas, such as an argon (Ar) gas, into the plasma generation chamber 24. A plurality of plasma magnetic field generators 26 is mounted circumferentially around the plasma generation chamber 24. The interaction of a high-frequency magnetic field induced by the microwaves and a magnetic field from the plasma magnetic field generators 26 generates a high-density plasma within the plasma generation chamber 24.

A drum-shaped substrate holder 32 is provided within the vacuum chamber 28 so as to be rotatable about an axis (located perpendicular relative to a sheet surface of the drawing) disposed perpendicular to a wall surface of the vacuum chamber 28.

A plurality of wafers 33 (six shown in this embodiment) are arranged circumferentially on the substrate holder 32 at regular intervals, and a high-frequency power source 30 is connected to the substrate holder 32.

A hollow cylindrical shielding cover 34, made of metal, radially surrounds the substrate holder 32 to define therebetween a space of predetermined dimension. This shielding cover 34 is connected to a grounded electrode. This shielding cover 34 is mounted for the purpose of preventing generation of discharges between the vacuum chamber 28 and areas of the substrate holder other than target film-forming locations thereon, which discharges would otherwise be generated when an RF voltage is applied to the substrate holder 32 for film formation.

The shielding cover 34 has a first opening 35 through which a plasma from the plasma generation chamber 24 is directed to the wafers 33 mounted on the substrate holder 32. The vacuum chamber 28 incorporates a reaction gas inlet line 36, and a leading end of the reaction gas inlet line 36 is positioned above the first opening 35.

Figure 6:
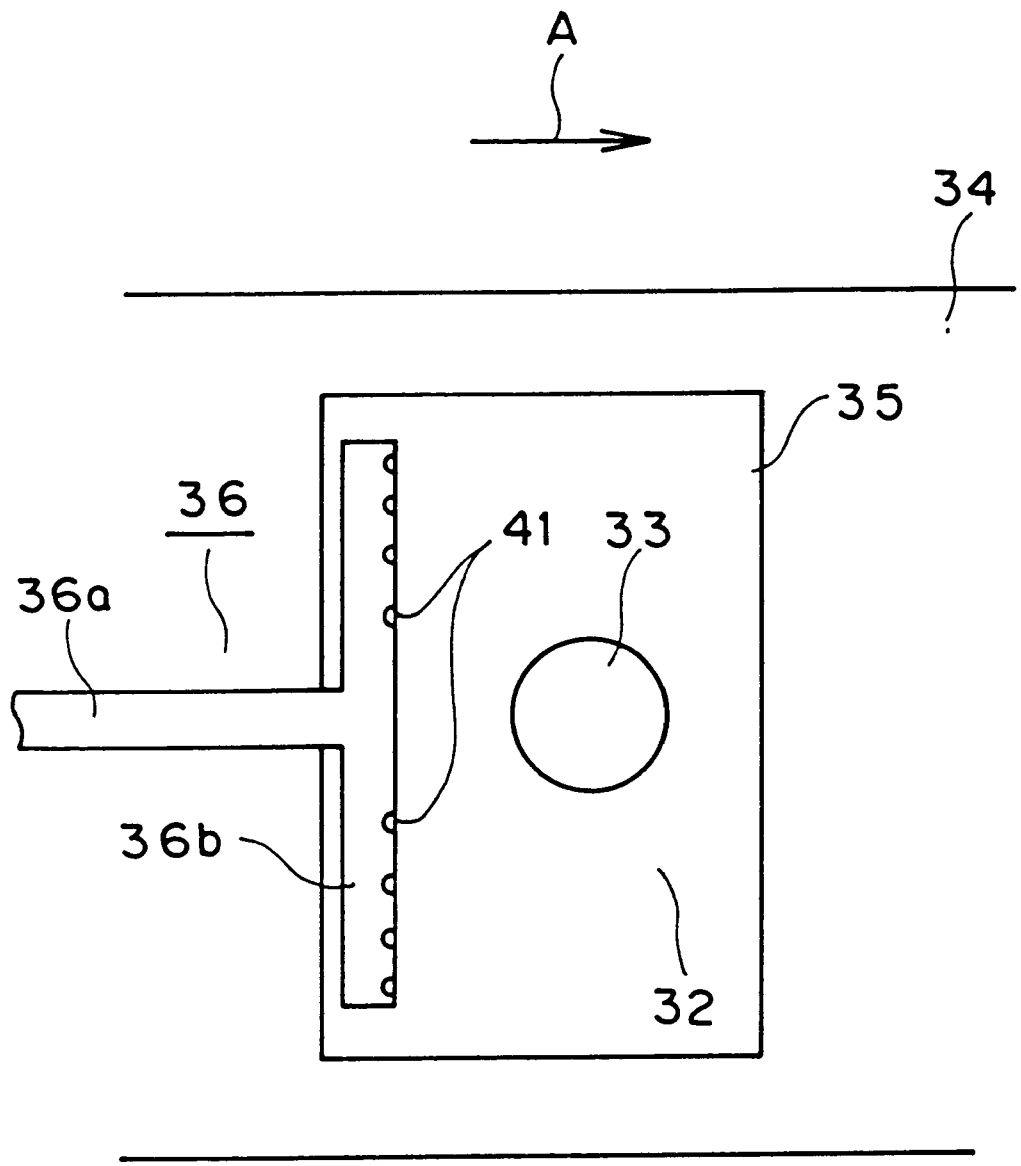
FIG. 6 is a schematic plan view showing the first opening portion of the apparatus of FIG. 5 and its vicinities.
Figure 7:
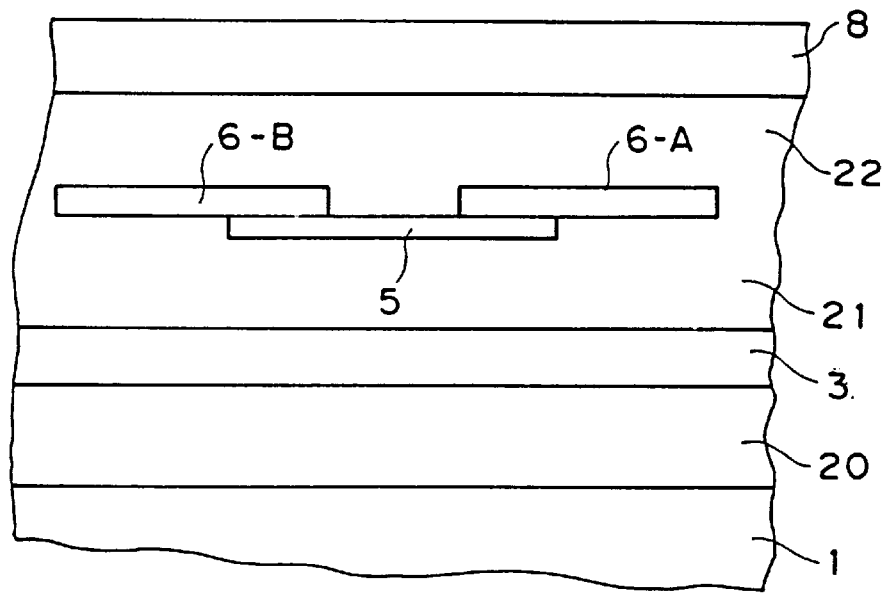
FIG. 7 is a schematic cross-sectional view of a proposed prior art thin film magnetic head.
Figure 8:
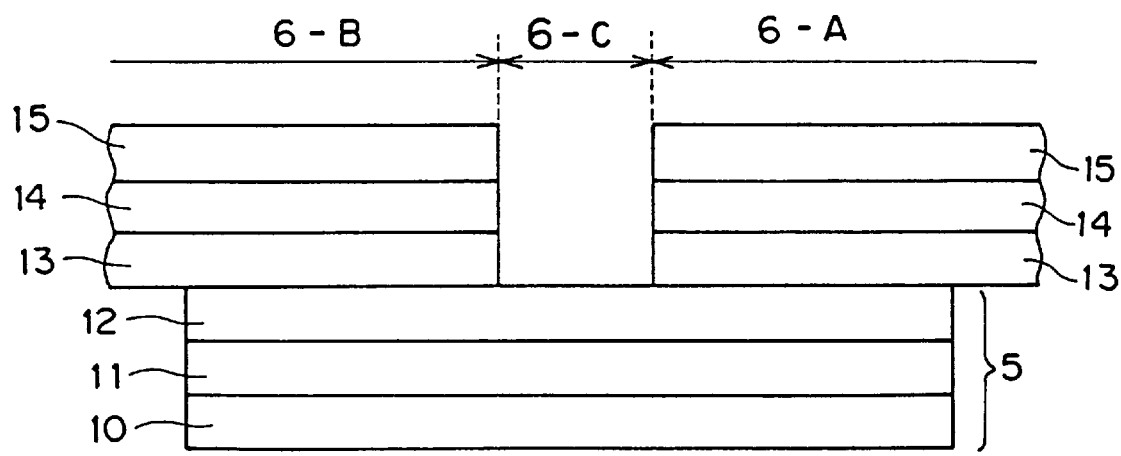
FIG. 8 is a partly enlarged view showing the MR element layer 5, as well as the lead layers 6-A, 6-B, incorporated in the prior art thin film magnetic head of FIG. 7.

FIG. 6 is a plan view showing this leading end of the reaction gas inlet line 36 and its vicinity.

Referring to FIG. 6, the reaction gas inlet line 36 includes a gas inlet portion 36a for introducing a raw material gas, such as a $CH_4$ gas, into the vacuum chamber 28 from the exterior, and a gas discharge portion 36b for perpendicular connection to the gas inlet portion 36a.

The gas discharge portion 36b is arranged to perpendicularly cross a rotational direction A of the substrate holder 32, and is positioned above the first opening 35. In the plan view, the gas discharge portion 36b is located upstream along the rotational direction A within the opening 35. The gas discharge portion 36b has plural holes 41 each directed downwardly at an angle of about 45 degrees. In this embodiment, eight holes 41 are provided.

Referring again to FIG. 5, the shielding cover 34 has at its bottom a second opening 43 which vertically faces the first opening 15. Located below the second opening 43 is a target 46 comprised of material atoms constituting the first interlayer 54 and the second interlayer 58. Disposed in the vicinity of the target 46 is an ion gun 47 which directs ions in an inert gas to the target 46 for sputtering the target 46.

In this embodiment, an Ar gas is employed as the inert gas. The target 46 and the ion gun 47, in combination, serve to pass the material atoms constituting the first interlayer 54 or the second interlayer 58 through the second opening 43 to be discharged onto the wafers 33.

EXAMPLES

EXAMPLE 1 AND EXAMPLE 2

The apparatus of FIG. 5 was employed to form, on a wafer, Si layers as a first interlayer 54 and a second interlayer 58, as well as hydrogenated amorphous carbon films as a lower gap insulative layer 55 and an upper gap insulative layer 59.

First, the vacuum chamber 28 was evacuated to a pressure of $10^{-5}$–$10^{-4}$ Torr., followed by rotation of the substrate holder 32 at a speed of about 10 rpm. Then, an Ar gas was supplied to the ion gun 47 to obtain Ar ions which were directed onto a surface of the Si target 46, wherein an acceleration voltage and ionic current density of the Ar ions was set at 900 eV and at 0.4 mA/cm$^2$, respectively.

The above process was continued for about 1 minute to form, on a surface of a shielding layer 53, the first Si interlayer 54 to a thickness of 20 Å.

The emission of Ar ions was then discontinued to commence supplying the Ar gas at $5.7 \times 10^{-4}$ Torr. from the ECR plasma generating apparatus. Concurrently, the microwave supplying means 21 supplied a 2.45 GHz microwave at 200 W to produce an Ar plasma within the plasma generation chamber 24. The produced Ar plasma was passed through the first opening 35 and directed onto a surface of the first interlayer 54.

Concurrently with the above, the high-frequency power source 30 applied a 13.56 MHz RF voltage to the substrate holder 32 to cause a wafer 33 to produce a self-bias voltage, while the reaction gas inlet line 36 supplied a $CH_4$ gas at $1.0 \times 10^{-3}$ Torr., to thereby form a hydrogenated amorphous carbon film (DLC film).

Through the above process, the lower gap insulative layer 55 was formed, on the first interlayer 54, to a thickness of 1000 Å. The similar process was further repeated to form the second interlayer 58 of 20 Å thickness, and successively to form the upper gap insulative layer 50 of 1000 Å thickness on the second interlayer 58. A thin film magnetic head was thus prepared (EXAMPLE 1).

Likewise, a lower gap insulative layer 55 was formed, on a first interlayer 54 (20 Å thick), to a thickness of 400 Å, and an upper gap insulative layer 59 was formed, on a second interlayer 58 (20 Å thick), to a thickness of 400 Å to prepare a thin film magnetic head (EXAMPLE 2).

Figure 2:
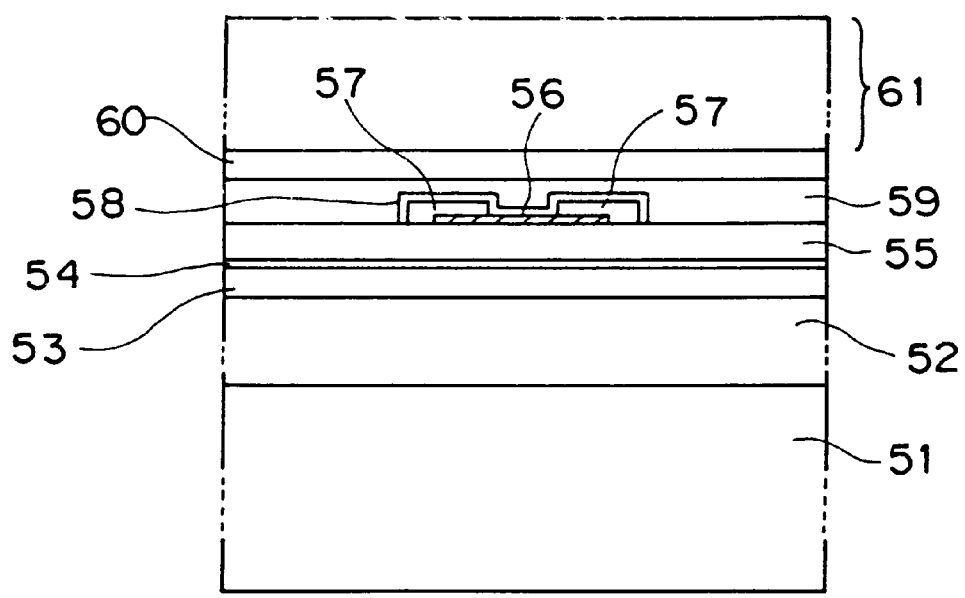
FIG. 2 is a schematic cross-sectional view of another embodiment of the thin film magnetic head of the present invention.

FIG. 2 shows an exemplary modification of the thin film magnetic head of FIG. 1. The thin film magnetic head of FIG. 1 is identical to that of FIG. 1, except that a second interlayer 58 was formed on an MR element layer 56 and an electrode layer 57, exclusively.

Such a modified thin film magnetic head can be prepared in the same manner as employed in preparing the thin film magnetic head of FIG. 1, with the exception that after the second interlayer 58 was formed to expand on the lower gap insulative layer 55, the MR element layer 56 and the electrode layer 57, a portion of the second interlayer 58 formed on the lower gap insulative layer 55 was etched for removal.

Figure 3:
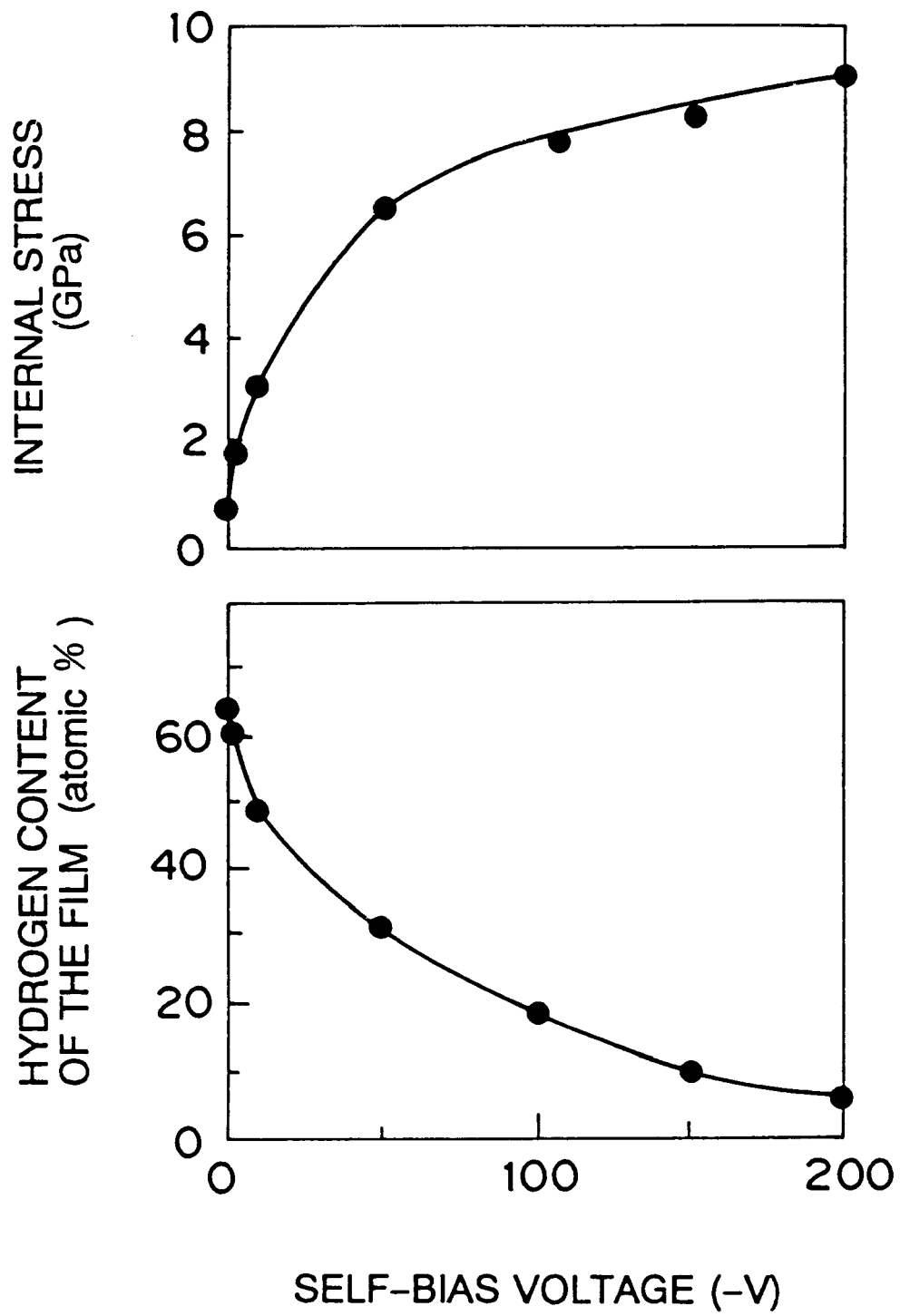
FIG. 3 is a graph of the self-bias voltage vs. the hydrogen concentration as well as the internal stress in the upper and lower gap insulative layers.

FIG. 3 is a graph showing the internal stress and hydrogen content in the hydrogenated amorphous carbon film of 1000

Å thickness, as used for each of the lower gap insulative layer 55 and upper gap insulative layer 59, in relation to the self-bias voltage.

Referring to FIG. 3, it is appreciated that the concentration of hydrogen incorporated in the hydrogenated amorphous carbon film, as well as its internal stress, are controlled by varying the self-bias voltage. That is, as the self-bias voltage increases, the concentration of hydrogen incorporated in the hydrogenated amorphous carbon film decreases while its internal stress increases. It therefore becomes possible to predict the internal stress by determining the concentration of hydrogen incorporated in the film.

Figure 4:
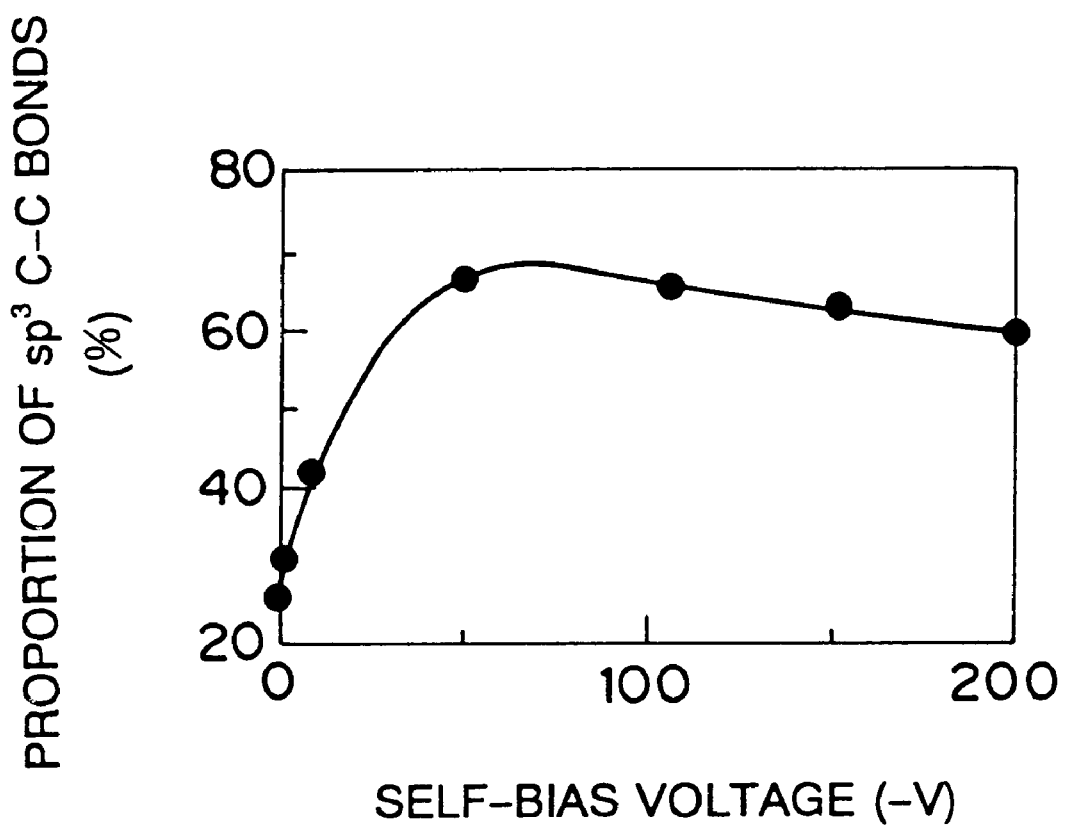
FIG. 4 is a graph of the self-bias voltage versus the ratio of $sp^3$ bonding between carbon molecules in the hydrogenated amorphous carbon film.

FIG. 4 shows the $sp^3$ bonding between carbon atoms contained in the hydrogenated amorphous carbon film in relation to the self-bias voltage.

Referring to FIG. 4, it is appreciated that the proportion of carbon—carbon $sp^3$ bonds contained in the film changes with varying self-bias voltage. That is, the proportion of $sp^3$ bonds can be controlled by varying the self-bias voltage. Also, the specific resistances of the hydrogenated amorphous carbon films formed consistently with the graph of FIG. 4 were determined. The results confirmed their values as ranging from $10^9$ Ω•cm to $10^{12}$ Ω•cm.

Then, a hydrogenated amorphous carbon film having a high internal stress (high-stress film), a hydrogenated amorphous carbon film having a low internal stress (low-stress film) and an $Al_2O_3$ film were respectively formed each to a thickness of 1000 Å to determine their internal stresses and hardnesses. The self-bias voltages applied when forming the above films, as well as internal stresses and hardnesses of the films formed, are given in Table 1.

TABLE 1

|  | High Stress Film | Low Stress Film | $Al_2O_3$ Film |
|---|---|---|---|
| Self-Bias Voltage | −50V | −10V | — |
| Internal Stress (Film Thickness of 1000Å) | 6.5Gpa | 3.2GPa | 1.1GPa |
| Vickers Hardness | 3000 | 1000 | 800 |

It is appreciated from Table 1 that the high-stress and low-stress films are higher both in internal stress and in hardness than the comparative $Al_2O_3$ film.

The internal stress of a film can be determined generally from the degree of deformation of a substrate on which the film is formed. In specific, the internal stress can be evaluated by determining a degree of deflection which appears when the film is formed on the substrate while allowing the stress produced to be exerted thereon, and which depends on the shape and elastic constant of the substrate. This technique is referred to as "deflection method" (Applied Physics, Vol. 56, No. 7 (1987), pp. 923–924), and was employed to determine the internal stress of the films shown in Table 1.

Next, the films having different internal stresses given in Table 2 were formed for the lower gap insulative layer 55 and the upper gap insulative layer 59 to prepare five types of thin film magnetic heads; those prepared in Example 1, Example 2, and Comparative Examples 1 through 3. The power-applied life test was conducted. In addition, they were subjected to a sliding test with a recording medium for a given time period for subsequent determination of the wear amount of the MR element layer 56. The results are given in Table 2. For the results from the life test, those superior to Comparable Example 3 are indicated by the rating of ⊚, and those comparable to Comparable Example 3 by the rating of ○. The life test was carried out by allowing a current to flow through the MR element layer 56 and determining the service life until the current value fell below a specified value.

TABLE 2

| | Upper Gap Insulative Layer Material | Lower Gap Insulative Layer Material | Film Thickness Each of Upper and Lower Gap Insulative Layer Material | Life Test Results | Wear Amount of MR Element Layer After Subjected to Slide Test*[1] |
|---|---|---|---|---|---|
| Exp. | | | | | |
| 1 | Low stress film | High Stress Film | 1000Å | ⊚ | ¼ or less |
| 2 | Low Stress Film | High Stress Film | 400Å | ⊚ | ¼ or less |
| Comp. Exp. | | | | | |
| 1 | High Stress Film | High Stress Film | 1000Å | ○ | ⅕ or less |
| 2 | Low Stress Film | Low Stress Film | 1000Å | ⊚ | ½ or less |
| 3 | $Al_2O_3$ Film | $Al_2O_3$ Film | 1000Å | — | 1 |

*[1]Comparison Relative to Comp. Exp.3

As shown in Table 2, Comparative Example 1 is comparable in power applied service life to Comparative Example 3, but Examples 1 and 2, as well as Comparative Example 2, are superior in power applied service life to Comparative Example 3.

This is believed likely due to an adverse influence of the increased internal stress in the upper gap insulative layer 59 upon the MR element layer 56.

With respect to the wear amount of the MR element layer 56 after having been subjected to the slide test, those in Examples 1 and 2 are one fourth or less of that in Comparative Example 3 and smaller than that in Comparative Example 2.

This is believed because the highly hard, and accordingly highly wear-resistant nature of the lower gap insulative layer 55 serves to protect the very thin MR element layer 56.

Next, for each of the thin film magnetic heads prepared in Example 1, Example 2 and Comparative Example 3, the current was measured which leaked from the MR element layer 56 into the shielding layer 53. For comparative purposes, each of the upper and lower gap insulative layers was made from an $Al_2O_3$ film of 400 Å thickness to prepare a thin film magnetic head (Comparative Example 4) which was also measured for its leakage current. The measurement results are given in Table 3.

TABLE 3

| | Exp. 1 | Exp. 2 | Comp. Exp. 3 | Comp. Exp. 4 |
|---|---|---|---|---|
| Material for Upper and Lower Gap Insulative Layers | Hydrogenated Amorphous Carbon Film | | $Al_2O_3$ Film | |

TABLE 3-continued

|  | Exp. 1 | Exp. 2 | Comp. Exp. 3 | Comp. Exp. 4 |
| --- | --- | --- | --- | --- |
| Film Thickness of Upper and Lower Gap Insulative Layers (Å) | 1000 | 400 | 1000 | 400 |
| leakage Current From MR Element Layer to Shielding Layer*[1] | 17 | 27 | 100 | 374 |

*[1]Comparison Relative to Comp. Exp.3

As shown in Table 3, when compared relative to Comparative Example 3, Examples 1 and 2 each show a markedly reduced leak current value, while Comparative Example 4, in which each of the gap insulative layers has a reduced thickness of 400 Å, shows 3.74 times as high a leakage current value.

This demonstrates that the use of the hydrogenated amorphous carbon film for each of the lower and upper gap insulative layers 55 and 59 enables reduction thereof in thickness, as well as a marked reduction in leakage current compared to those using the $Al_2O_3$ film.

In the present invention, the respective components of the lower gap insulative layer 55 and the upper gap insulative layer 59 are not limited to those used in the above Examples, and may contain a suitable amount of impurities such as Si, B, N or O to improve their sliding characteristics or the others.

Also, any material, other than Si, can be employed for the first interlayer 54 and the second interlayer 58, so far as its use serves to improve the adhesion between the lower gap insulative layer 55 and an underlying layer of the first interlayer 54, and between the upper gap insulative layer 59 and an underlying layer(s) of the second interlayer 54.

Also, although Si was used in the above-described Examples for each of the first interlayer 54 and the second interlayer 58, other materials can be employed which include Ru, Mo, W, Cr, C, Ge, Hf, Zr or Ti, or alternatively, any of those elements each combined with at least one element selected from nitrogen, oxygen and carbon can be employed. Those materials were confirmed as providing similar results as Si by experiments.

Also, the temperatures at which the films were formed under the above-described film-forming conditions to respectively constitute the lower and upper gap insulative layers were confirmed as being not higher than 100° C. by experiments.

Furthermore, although the above-described Examples varied the self-bias voltage as a technique of controlling the internal stress, it is not limiting. The internal stress of a film can be controlled by incorporating nitrogen in the film, for example.

For example, a nitrogen-incorporated, hydrogenated amorphous carbon film can be formed by setting the pressures of $CH_4$ and $N_2$ gases at $1 \times 10^{-3}$ Torr. and $5.7 \times 10^{-4}$ Torr., respectively, under the film-forming condition shown in Table 1 for the high stress film. The resulting film had an internal stress of 3.9 GPA and a Vickers hardness of 2800 Hv. Therefore, the incorporation of nitrogen into the hydrogenated amorphous carbon film imparts an increased hardness and reduced internal stress thereto.

As an alternative method of controlling the internal stress of the hydrogenated amorphous carbon film, an internal stress relaxation layer may be disposed in the interior thereof. Such a method will be explained below.

Figure 9:
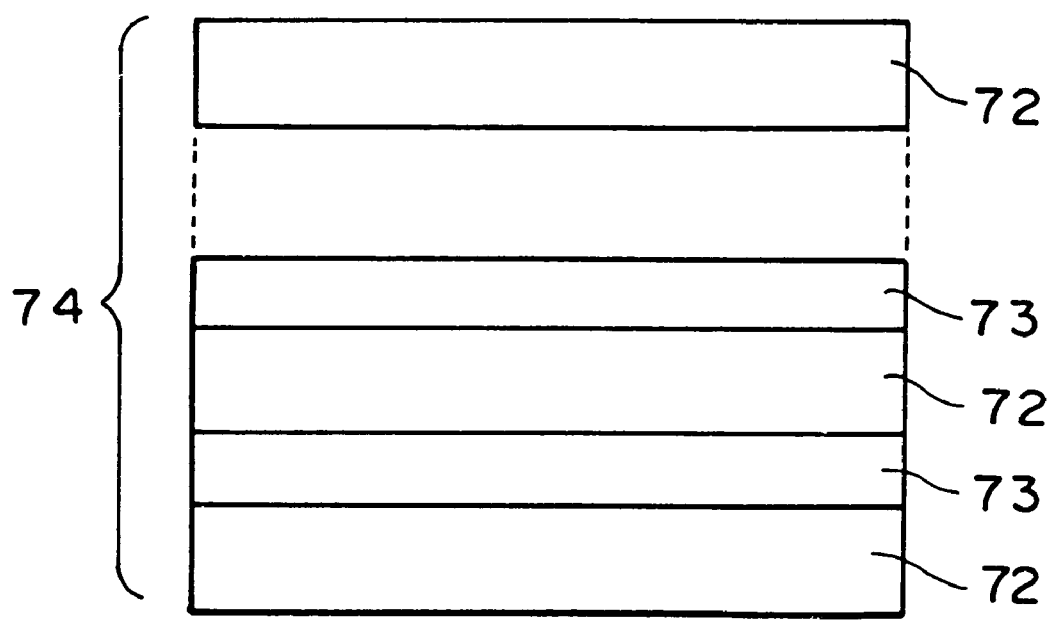
FIG. 9 is a schematic cross-sectional view of the hydrogenated amorphous carbon film incorporating the internal stress relaxation layer.

FIG. 9 is a schematic cross-sectional view of a hydrogenated amorphous carbon film which incorporates the internal stress relaxation layer and which can be employed to constitute the upper or/and lower gap insulative layer according to the present invention. The hydrogenated amorphous carbon film 74 includes carbon layers 72 alternating with internal stress relaxation layers 73. This provision of one or more internal stress relaxation layer(s) in the hydrogenated amorphous carbon film serves to reduce the internal stress of the hydrogenated amorphous carbon film.

Figure 10:
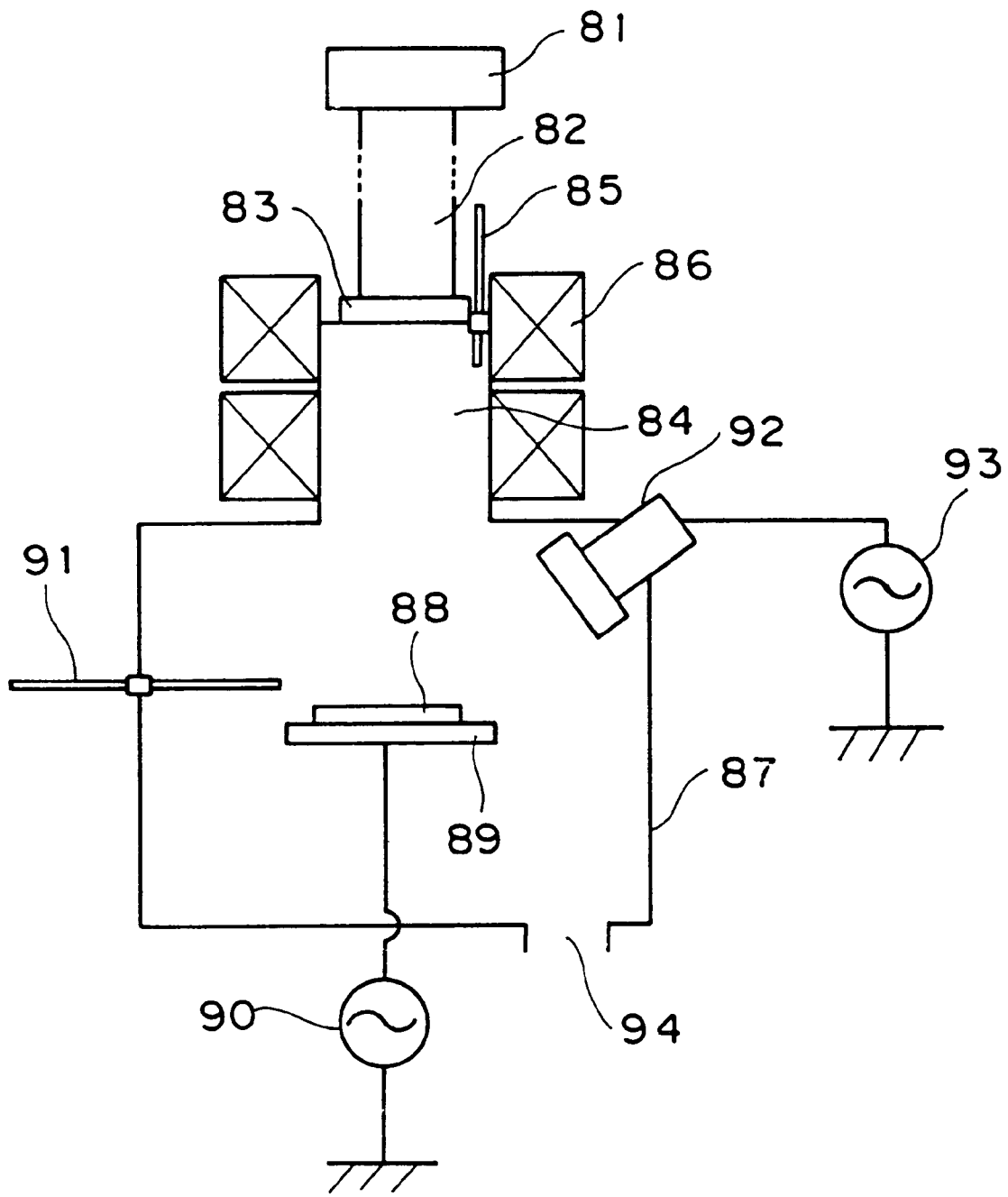
FIG. 10 is a schematic cross-sectional view showing an exemplary thin film forming apparatus which is capable of forming the hydrogenated amorphous carbon film incorporating the internal stress relaxation layer shown in FIG. 9.

FIG. 10 is a schematic cross-sectional view showing an exemplary apparatus for forming the hydrogenated amorphous carbon film incorporating the internal stress relaxation layer. This thin film forming apparatus enables a thin film formation by both or either of an ECR plasma CVD technique and a sputtering technique. Referring to FIG. 10, a plasma generation chamber 84, as well as a reaction chamber (now shown) for locating a substrate 88 therein, are disposed in a vacuum chamber 87. A waveguide 82 connects the plasma generation chamber 84 to a microwave generator 81. A microwave inlet window 83 is disposed at the connection of the waveguide 82 and the plasma generation chamber 84. Connected to the plasma generation chamber 84 is a discharge gas inlet line 85 for introducing a discharge gas, such as an argon (Ar) gas, into the plasma generation chamber 84. A plasma magnetic field generator 86 is further disposed to radially surround the plasma generation chamber 84.

Disposed in the interior of the reaction chamber within the vacuum chamber 87 is a substrate holder 89 on which the substrate 88 is placed. Connected to the reaction chamber within the vacuum chamber 87 is a reaction gas inlet line 91 for introducing a reaction gas which serves as a raw material gas in the plasma CVD method. Connected to the substrate holder 89 is a high-frequency power source 90 for producing a self-bias voltage in the substrate 88.

Also disposed within the vacuum chamber 87 is a sputter source 92 mounting a target for forming a thin film on the substrate 88 through a sputtering technique. A high-frequency power source 93 is further provided for supplying a high-frequency power to the sputter source 92. The vacuum chamber 87 is evacuated through an air outlet 94 to a predetermined pressure.

EXAMPLE 3

A carbon film shown in FIG. 9 was formed employing the thin film forming apparatus of FIG. 10. The following Process 1 for forming a carbon layer and Process 2 for forming an internal stress relaxation layer were repeated alternately to form the carbon film. In this Example, a graphite target was employed to sputter form an amorphous carbon film containing substantially no hydrogen which serves as the internal stress relaxation layer.

Process 1

In the thin film forming apparatus of FIG. 10, the substrate 88 is mounted on the substrate holder 89 and the vacuum chamber 87 is evacuated to a pressure of $10^{-5} \sim 10^{-7}$ Torr. Then, the Ar gas at $5.7 \times 10^{-4}$ Torr. is introduced, through the discharge gas inlet line 85, to the plasma generation chamber 84, and concurrently a microwave at 2.45 GHz and 100 W is supplied from the microwave generator 81 into the plasma generation chamber 84 to produce, within the plasma generation chamber 84, an Ar plasma which is subsequently directed onto a surface of the substrate 88. A reaction gas inlet line 91 supplies a $CH_4$ gas at $7.6 \times 10^{-4}$ Torr. The $CH_4$ gas supplied from the reaction gas inlet line 91 is decomposed by the action of the plasma to produce carbon atoms which become highly reactive carbon ions or neutral active carbon atoms for acceleration onto the surface of the substrate 88. Concurrently, the high-frequency power source 90 applies a 13.56 MHz RF power to the substrate holder 89 so that the substrate 88 produces a self-bias voltage of −50 V. In accordance with the above process, a carbon layer is formed to a thickness of 900 Å by a single film-forming process.

Process 2

The $CH_4$ gas supply from the reaction gas inlet line 91 is terminated to commence supplying the Ar gas at $1 \times 10^{-3}$ Torr. from the discharge gas inlet line 85. Concurrently, the high-frequency power source 93 applies a 13.56 MHz RF power to the sputter source 92 for actuation thereof. As a result, an amorphous carbon film layer of 100 Å thickness is formed on the substrate 88 to serve as the internal stress relaxation layer.

Process 1 and Process 2 were alternately repeated ten times each and finally Process 1 was carried out once. Accordingly, ten sets of a unit comprised of the carbon layer 72 and the internal stress relaxation layer 73 were consecutively layered, and one additional carbon layer 72 was finally stacked thereon to provide a carbon film 74 of a total of twenty one layers, as shown in FIG. 9. An overall thickness of this carbon film 74 was 1.09 μm.

COMPARATIVE EXAMPLE 5

The above Process 1 was followed to form a carbon layer, i.e. a thin diamond-like carbon film of 1.09 μm thickness.

COMPARATIVE EXAMPLE 6

The above Process 2 was followed to form an amorphous carbon layer, i.e. a thin film of 1.09 μm thickness.

Measurement of Vickers Hardness and Internal Stress

The films obtained respectively in Example 3 and Comparative Examples 5 and 6 were measured for Vickers hardness and internal stress. The results are given in Table 4.

TABLE 4

|  | Exp. 3 | Comp. Exp. 5 | Comp. Exp. 6 |
|---|---|---|---|
| Vickers Hardness | 3000 | 3100 | 270 |
| Internal Stress* | 0.72 | 1.0 | 0.01 |

*Relative Values When The Internal Stress Relative to The Film Obtained in Comp. Exp.5 is Taken as 1.

As apparent from Table 4, the carbon film obtained in Example 3 exhibits a Vickers hardness comparable to that of the carbon layer, i.e. a diamond-like carbon film obtained in Comparative Example 5, but exhibits a decreased internal stress compared to the diamond-like carbon film obtained in Comparative Example 5.

Figure 11:
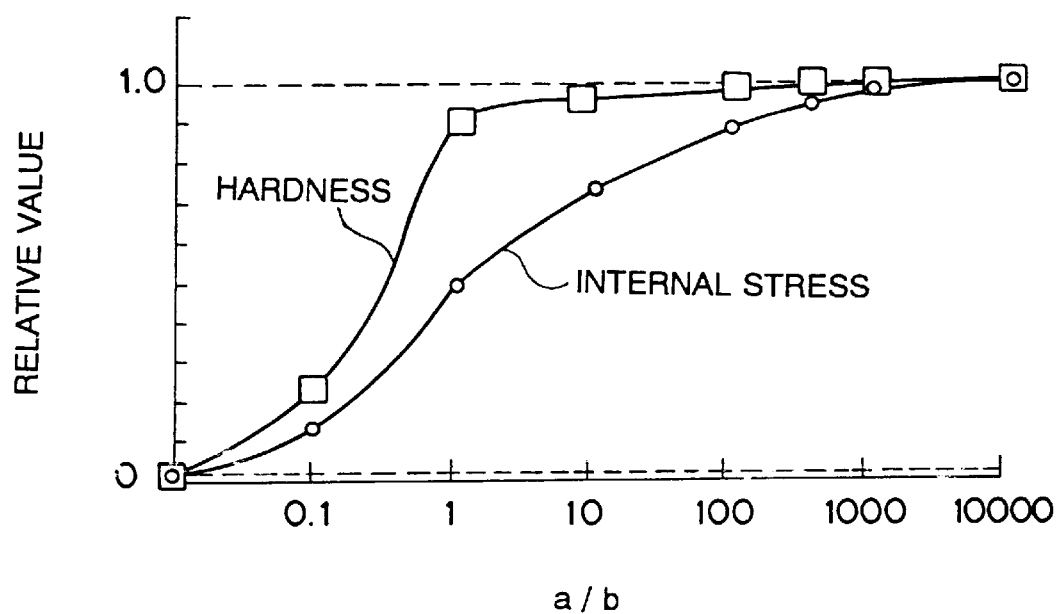
FIG. 11 is a graph showing the Vickers hardness and internal stress when the ratio of the film thickness a of the carbon layer to the film thickness b of the internal stress relaxation layer is varied.

FIG. 11 is a graph showing the Vickers hardness and internal stress of a carbon film when the ratio a/b of the film thickness a of the carbon layer to the film thickness b of the internal stress relaxation layer is varied. The values of the Vickers hardness and internal stress given in the graph indicate the relative values when the Vickers hardness and internal stress of the film obtained in Comparative Example 5 were respectively taken as 1. The measured carbon film was a multilayer film including eleven carbon layers and ten internal stress relaxation layers and had an overall thickness of 1.09 μm, as identical to the carbon film obtained in Example 3.

As can be clearly seen from the results given in FIG. 11, the carbon film exhibits a comparable hardness and a reduced internal stress relative to the diamond-like carbon film obtained in Comparative Example 3 when the ratio a/b of film thicknesses is within the range of 1~1000, and a similarly comparable hardness and a further reduced internal stress relative to the diamond-like carbon film obtained in Comparative Example 3 when the ratio a/b of film thicknesses is within the range of 10~500.

EXAMPLE 4

An Si layer was formed as an internal stress relaxation layer. Step 1 and Step 2 according to Example 3 were followed, except that in Step 2, a sputter source 92 mounting an Si target was employed to sputter form the Si layer of about 100 Å thickness which served as the internal stress relaxation layer. As a result, a carbon film was obtained which included the Si layer stacked on the carbon layer.

The carbon film obtained was measured for Vickers hardness and internal stress. The Vickers hardness was 3050 Hv. The relative value of its internal stress was 0.75 when the measured internal stress of the diamond-like film obtained in Comparative Example 5 was taken as 1.

EXAMPLE 5

A W layer was formed as an internal stress relaxation layer. Step 1 and Step 2 according to Example 3 were followed, except that in Step 2, a sputter source 92 mounting a W target was employed to sputter form the W layer of about 100 Å thickness which served as the internal stress relaxation layer. As a result, a carbon film was obtained which included the W layer stacked on the carbon layer.

The carbon film obtained was measured for Vickers hardness and internal stress. The Vickers hardness was 3000 Hv. The relative value of its internal stress was 0.73 when the measured internal stress of the diamond-like film obtained in Comparative Example 5 was taken as 1.

EXAMPLE 6

A Zr layer was formed as an internal stress relaxation layer. Step 1 and Step 2 according to Example 3 were followed, except that in Step 2, a sputter source 92 mounting a Zr target was employed to sputter form the Zr layer of about 100 Å thickness which served as the internal stress relaxation layer. As a result, a carbon film was obtained which included the Zr layer stacked on the carbon layer.

The carbon film obtained was measured for Vickers hardness and internal stress. The Vickers hardness was 3000 Hv. The relative value of its internal stress was 0.73 when the measured internal stress of the diamond-like film obtained in Comparative Example 5 was taken as 1.

EXAMPLE 7

An SiC layer was formed as an internal stress relaxation layer. Step 1 and Step 2 according to Example 3 were followed, except that in Step 2, a sputter source 92 mounting an SiC target was employed, and a $CH_4$ gas at $9.5 \times 10^{-5}$ Torr. was supplied from the reaction gas inlet line 91 to sputter form the SiC layer of about 100 Å thickness which served as the internal stress relaxation layer. As a result, a carbon film was obtained which included the SiC layer stacked on the carbon layer.

The carbon film obtained was measured for Vickers hardness and internal stress. The Vickers hardness was 3080 Hv. The relative value of its internal stress was 0.8 when the measured internal stress of the diamond-like film obtained in Comparative Example 5 was taken as 1.

In the above Examples, the amorphous carbon, Si, W, Zr and SiC layers were sputter formed which respectively served as the internal stress relaxation layers. However, experiments indicated that the use of the above-listed materials, other than those used in the Examples, for the internal stress relaxation layer also resulted in hard carbon films having high hardnesses and low internal stresses. They revealed Vickers hardnesses of about 3000 Hv and relative values of their internal stresses were about 0.7 when the measured internal stress of the diamond-like film obtained in Comparative Example 5 was taken as 1.

What is claimed is:

1. A thin film magnetic head comprising:

a magnetoresistive element portion movable over and relative to a magnetic recording medium for reading information stored therein;

upper and lower shielding layers disposed with said magnetoresistive element portion therebetween for magnetically shielding said magnetoresistive element portion; and an upper gap insulative layer interposed between said upper shielding layer and said magnetoresistive element portion, and a lower gap insulative layer interposed between said lower shielding layer and said magnetoresistive element portion, wherein each of said upper and lower gap insulative layers comprises a hydrogen-incorporated film, and wherein the hydrogen contents of said upper and lower gap insulative layers are different from each other.

2. A thin film magnetic head comprising:

a magnetoresistive element portion movable over and relative to a magnetic recording medium for reading information stored therein;

upper and lower shielding layers disposed with said magnetoresistive element portion therebetween for magnetically shielding said magnetoresistive element portion; and an upper gap insulative layer interposed between said upper shielding layer and said magnetoresistive element portion, and a lower gap insulative layer interposed between said lower shielding layer and said magnetoresistive element portion, wherein each of said upper and lower gap insulative layers comprises a hydrogen-incorporated film, and wherein a hydrogen content of said upper gap insulative layer is higher than a hydrogen content of said lower gap insulative layer.

3. The thin film magnetic head of claim 2, wherein the hydrogen content of said upper gap insulative layer is in the range of 45–65 atomic percent and the hydrogen content of said lower gap insulative layer is in the range of 5–45 atomic percent.

4. The thin film magnetic head of claim 2, wherein said upper gap insulative layer has a lower internal stress relative to said lower gap insulative layer.

5. The thin film magnetic head of claim 2, wherein said lower gap insulative layer has a higher hardness than said upper gap insulative layer.

6. The thin film magnetic head of claim 2, wherein each of said upper and lower gap insulative layers is a hydrogenated amorphous carbon film.

7. The thin film magnetic head of claim 2, wherein at least one of said upper and lower gap insulative layers includes an internal stress relaxation layer.

8. A thin film magnetic head comprising:

a magnetoresistive element portion movable over and relative to a magnetic recording medium for reading information stored therein;

upper and lower shielding layers disposed with said magnetoresistive element portion therebetween for magnetically shielding said magnetoresistive element portion; and an upper gap insulative layer interposed between said upper shielding layer and said magnetoresistive element portion, and a lower gap insulative layer interposed between said lower shielding layer and said magnetoresistive element portion, wherein each of said upper and lower gap insulative layers comprises a hydrogen-incorporated film, and wherein said upper gap insulative layer has an internal stress different from an internal stress of said lower gap insulative layer.

9. A thin film magnetic head comprising:

a magnetoresistive element portion movable over and relative to a magnetic recording medium for reading information stored therein;

upper and lower shielding layers disposed with said magnetoresistive element portion therebetween for magnetically shielding said magnetoresistive element portion; and an upper gap insulative layer interposed between said upper shielding layer and said magnetoresistive element portion, and a lower gap insulative layer interposed between said lower shielding layer and said magnetoresistive element portion, wherein each of said upper and lower gap insulative layers comprises a hydrogen-incorporated film, and wherein said upper gap insulative layer has an internal stress lower than an internal stress of said lower gap insulative layer.

10. The thin film magnetic head of claim 9, wherein the internal stress of said upper gap insulative layer is in the range of 0.01–4 GPa and the internal stress of said lower gap insulative layer is in the range of 4–10 GPa.

11. The thin film magnetic head of claim 9, wherein said lower gap insulative layer has a higher hardness than said upper gap insulative layer.

12. The thin film magnetic head of claim 9, wherein each of said upper and lower gap insulative layers is a hydrogenated amorphous carbon film.

13. The thin film magnetic head of claim 12, wherein at least one of said upper and lower gap insulative layers is an amorphous hydrogenated carbon film containing at least one element selected from Si, B. N and O.

14. The thin film magnetic head of claim 9, further comprising an interlayer disposed between said lower gap insulative layer and said lower shielding layer.

15. The thin film magnetic head of claim 14, wherein said interlayer is formed of at least one of Si, Ru, Mo, W, Cr, C, Ge, Hf, Zr and Ti, or any of those elements each combined with at least one element selected from nitrogen, oxygen and carbon.

16. The thin film magnetic head of claim 14, wherein said interlayer is a continuous film coexpansive with the neighboring layers of said interlayer.

17. The thin film magnetic head of claim 14, wherein said interlayer is an intermittent film consisting of plural island portions sandwiched between the neighboring layers of said interlayer.

18. The thin film magnetic head of claim 9, wherein at least one of said upper and lower gap insulative layers includes an internal stress relaxation layer.

19. The thin film magnetic head of claim 18, wherein said internal stress relaxation layer comprises a carbon film containing substantially no hydrogen.

20. The thin film magnetic head of claim 18, wherein said internal stress relaxation layer is formed of at least one of Si, Ru, Mo, W, Cr, Ge, Hf, Zr and Ti, or any of those element each combined with at least one element selected from nitrogen, oxygen and carbon.

21. The thin film magnetic head of claim 9, wherein each of said upper and lower gap insulative layers contains hydrogen in concentrations of 5–65 atomic percent.

22. The thin film magnetic head of claim 9, wherein each of said upper and lower gap insulative layers contains carbon—carbon bonds of which at least 25% are $sp^3$ carbon—carbon bonds.

23. The thin film magnetic head of claim 9, wherein the internal stress in each of said upper and lower gap insulative layers is in the range of 0.5–9.0 GPa.

24. The thin film magnetic head of claim 9, wherein each of said upper and lower gap insulative layers has a specific resistance in the range of $10^9$–$10^{12}$ Ω•cm.

25. The thin film magnetic head of claim 9, further comprising an interlayer disposed between said upper gap insulative layer and said magnetoresistive element portion.

26. The thin film magnetic head of claim 25, wherein said interlayer is formed of at least one of Si, Ru, Mo, W, Cr, C, Ge, Hf, Zr and Ti, or any of those elements each combined with at least one element selected from nitrogen, oxygen and carbon.

27. The thin film magnetic head of claim 25, wherein said interlayer is a continuous film coexpansive with the neighboring layers of said interlayer.

28. The thin film magnetic head of claim 25, wherein said interlayer is an intermittent film consisting of plural island portions sandwiched between the neighboring layers of said interlayer.

* * * * *

UNITED STATES PATENT AND TRADEMARK OFFICE
CERTIFICATE OF CORRECTION

PATENT NO. : 5,986,857

DATED : Nov. 16, 1999

INVENTOR(S) : Hitoshi Hirano et al.

It is certified that error appears in the above-identified patent and that said Letters Patent is hereby corrected as shown below:

Col. 2,   line 24, before "stored" replace "informations" by --information--;

Col. 9,   line 25, after "a" (second occurrence) delete "m";

Col. 11,  Table 3, col. 1, box 3, line 1, before "Current" replace "leakage" by --Leakage--;
          line 15, after "reduced" replace "leak" by --leakage--;

Col. 13,  line 35, replace the line to read --MEASUREMENT OF VICKERS HARDNESS AND INTERNAL STRESS--;

Signed and Sealed this

Eleventh Day of July, 2000

Attest:

Q. TODD DICKINSON

*Attesting Officer*        *Director of Patents and Trademarks*